(12) United States Patent
Jung et al.

(10) Patent No.: US 11,170,865 B1
(45) Date of Patent: Nov. 9, 2021

(54) AREA-EFFICIENT DYNAMIC MEMORY REDUNDANCY SCHEME WITH PRIORITY DECODING

(71) Applicant: QUALCOMM Incorporated, San Diego, CA (US)

(72) Inventors: Chulmin Jung, San Diego, CA (US); Bin Liang, San Diego, CA (US); Chi-Jui Chen, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/868,402

(22) Filed: May 6, 2020

(51) Int. Cl.
*G11C 29/00* (2006.01)
*G11C 29/02* (2006.01)
*G11C 29/20* (2006.01)
*G11C 29/12* (2006.01)
*G11C 29/44* (2006.01)
*G11C 29/10* (2006.01)

(52) U.S. Cl.
CPC ........... *G11C 29/022* (2013.01); *G11C 29/10* (2013.01); *G11C 29/12015* (2013.01); *G11C 29/20* (2013.01); *G11C 29/44* (2013.01); *G11C 29/787* (2013.01)

(58) Field of Classification Search
CPC ....................................................... G11C 17/16
USPC ....................................................... 365/225.7
See application file for complete search history.

(56) References Cited

U.S. PATENT DOCUMENTS

| 6,077,211 A * | 6/2000 | Vo ........................ G11C 29/848 365/200 |
| 2001/0028584 A1* | 10/2001 | Nakayama ........... G11C 29/848 365/203 |
| 2007/0038919 A1* | 2/2007 | Sekiguchi ........... G06F 11/1044 714/763 |
| 2008/0043898 A1* | 2/2008 | Kim ....................... G11C 17/18 377/75 |
| 2009/0168570 A1* | 7/2009 | Park ..................... G11C 29/846 365/200 |
| 2020/0321071 A1* | 10/2020 | Varadarajan ........... G11C 29/14 |

* cited by examiner

*Primary Examiner* — Min Huang
(74) *Attorney, Agent, or Firm* — Seyfarth Shaw LLP

(57) ABSTRACT

A method for a memory subsystem redundancy with priority decoding is described. The method includes dynamically repairing a local input/output (IO) unit of a first memory subsystem bank based on a current redundancy fuse input pattern of the first memory subsystem bank. The method also includes concurrently generating a redundancy shift signal in each global IO based on the current redundancy fuse input pattern to shift the repaired local IO unit and lower order local IO units of the first memory subsystem bank relative to the repaired local IO unit.

17 Claims, 7 Drawing Sheets

AREA-EFFICIENT DYNAMIC MEMORY REDUNDANCY SCHEME WITH PRIORITY DECODING

BACKGROUND

Field

The present disclosure generally relates to memory circuits. More specifically, aspects of the present disclosure relate to an area-efficient dynamic memory redundancy scheme with priority decoding.

Background

Memory is a vital component for wireless communications devices. For example, a cell phone integrates memory as part of an application processor. Many wireless applications depend on the functionality of static random access memory (SRAM), which is a type of volatile memory that consumes power to retain data. SRAM bit cells are generally implemented using complementary metal oxide semiconductor (CMOS) transistors.

Wireless communications device performance is continually driving a desire for maximum capacity SRAM-based memory, which forces the transistors within each bit cell into extremely small dimensions. Forcing the SRAM-based transistor bit cells into these extremely small dimensions increases the effects of process variations during the fabrication process, which can cause bit cell failure. Techniques for withstanding or preventing variation-induced SRAM bit cell failures in SRAM based memory systems are desired.

SUMMARY

A method for a memory subsystem redundancy with priority decoding is described. The method includes dynamically repairing a local input/output (IO) unit of a first memory subsystem bank based on a current redundancy fuse input pattern of the first memory subsystem bank. The method also includes concurrently generating a redundancy shift signal in each global IO based on the current redundancy fuse input pattern to shift the repaired local IO unit and lower order local IO units of the first memory subsystem bank relative to the repaired local IO unit.

A non-transitory computer-readable medium having program code recorded thereon for memory subsystem redundancy with priority decoding is described. The program code executed by a processor. The non-transitory computer-readable medium includes program code to dynamically repair a local input/output (IO) unit of a first memory subsystem bank based on a current redundancy fuse input pattern of the first memory subsystem bank. The non-transitory computer-readable medium also includes program code to concurrently generate a redundancy shift signal in each global IO based on the current redundancy fuse input pattern to shift the repaired local IO unit and lower order local IO units of the first memory subsystem bank relative to the repaired local IO unit.

A memory subsystem is described. The memory subsystem includes a first memory subsystem bank having local input/output (IO) units and a first redundancy input/output (IO) unit. The memory subsystem also includes a global IO controller having global input/output (IO) units. Each global IO unit corresponds to a respective one of the local IO units. Each global IO unit includes a fuse decoder configured to dynamically repair a repaired local IO unit based on a first bank redundancy fuse input pattern of the first memory subsystem bank. The global IO controller is configured to concurrently trigger a redundancy shift signal in each global IO unit based on the first bank redundancy fuse input pattern to shift the repaired local IO unit. In addition, shifting of lower order ones of the local IO units of the first memory subsystem bank relative to the repaired local IO unit is also triggered by the global IO controller.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
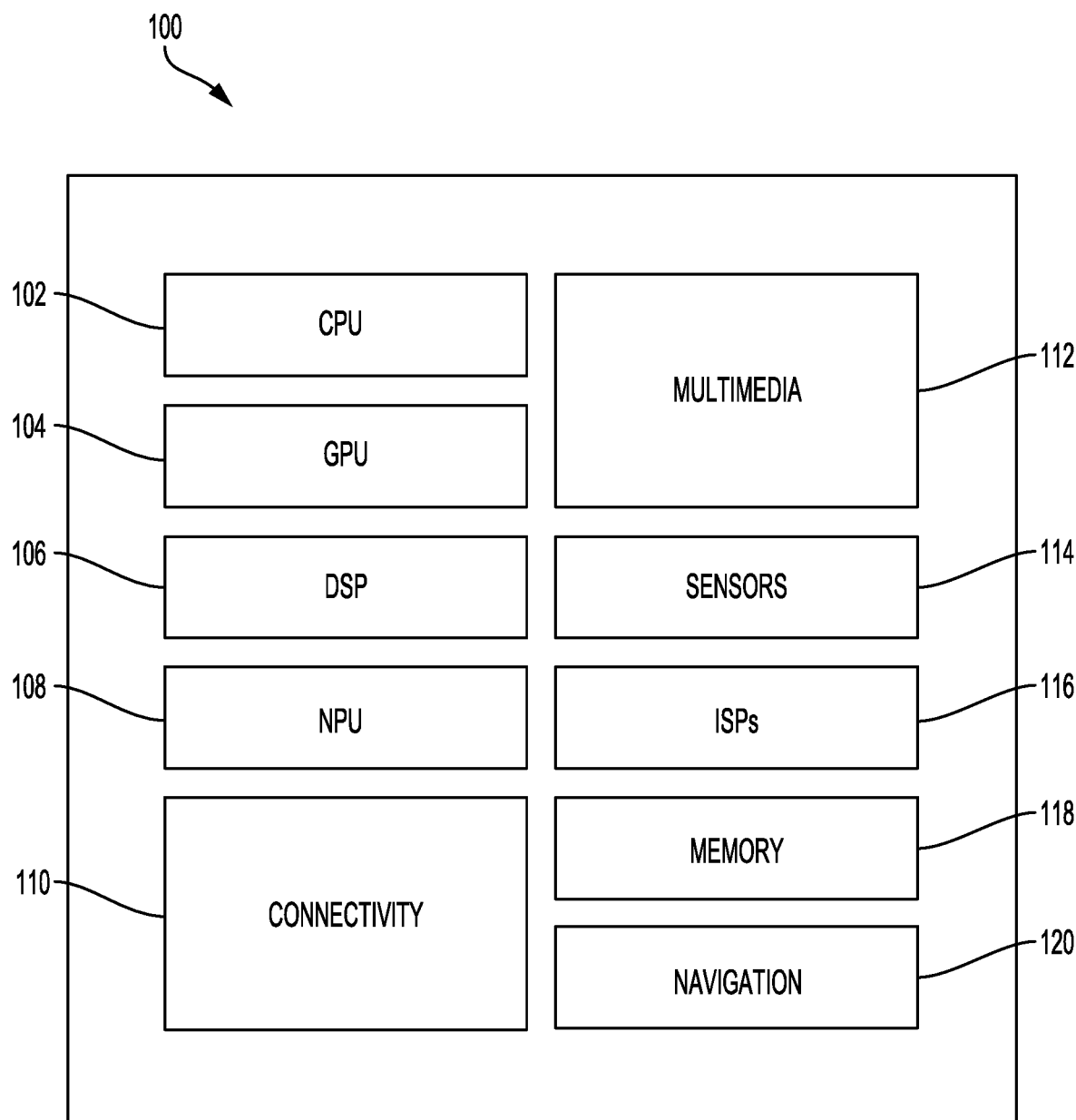
FIG. 1 illustrates an example implementation of a system-on-a-chip (SOC), including a memory configured according to a dynamic memory redundancy scheme with priority decoding, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

As described, the use of the term "and/or" is intended to represent an "inclusive OR," and the use of the term "or" is intended to represent an "exclusive OR." The word "exemplary" is used to mean "serving as an example, instance, or illustration." Any aspect described as "exemplary" is not necessarily to be construed as preferred or advantageous over other aspects.

Although particular aspects are described, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure, rather than limiting the scope of the disclosure being defined by the appended claims and equivalents thereof.

Memory is a vital component for wireless communications devices. For example, a cell phone integrates memory as part of an application processor. Many wireless applications depend on the functionality of static random access memory (SRAM). SRAM is a type of volatile memory that consumes power to retain data. SRAM bit cells are generally implemented using complementary metal oxide semiconductor (CMOS) transistors.

Wireless communications device performance is continually driving a desire for maximum capacity SRAM-based memory, which forces the transistors within each bit cell into extremely small dimensions. Forcing the SRAM-based transistor bit cells into these extremely small dimensions increases the effects of process variations during the fabrication process, which can cause bit cell failure. Techniques for withstanding or preventing variation-induced SRAM bit cell failures in SRAM-based memory systems include memory redundancy.

Memory redundancy may refer to the provisioning of extra memory cells, usually rows or columns, mapped into a memory array to replace defective (or nonconforming) bit cells. In semiconductor storage devices (e.g., a memory subsystem), a redundant circuit is added to repair function failures and improve yield. For example, the redundant circuit may be realized using a built-in self-test (BIST) circuit and a fuse component. That is, transistor variation that causes SRAM failures may be overcome with peripheral circuit assistance techniques. These peripheral circuit assistance techniques may include modifying wordlines, bitlines, or a cell supply to compensate for the defective (or nonconforming) bit cells.

Unfortunately, in memory subsystem design, the redundancy logic area grows proportionally along with the size of memory to maintain identical yield rate coverage. For example, the redundancy logic area grows due to an increased routing and decoding area for global signals and redundancy fuses. In addition, the redundancy logic area grows for providing additional power and area to implement a redundancy logic level shifter. These techniques may be referred to as a static redundancy scheme using local redundancy fuse inputs. Aspects of the present disclosure are directed to an area-efficient dynamic memory redundancy scheme with priority decoding.

Various aspects of a memory are presented in the context of a static random access memory (SRAM) subsystem configured according to a dynamic memory redundancy scheme with priority decoding. SRAM is volatile memory that consumes power to retain data. Nevertheless, as those skilled in the art will readily appreciate, such aspects may be extended to other memories and/or circuit configurations. Accordingly, references to the SRAM subsystem are intended only to illustrate aspects of the memory with the understanding that such aspects may be extended to a wide range of applications.

FIG. 1 illustrates an example implementation of a host system-on-a-chip (SOC) 100, which includes a memory 118 configured according to a dynamic memory redundancy scheme with priority decoding, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU 108 may be based on an ARM instruction set.

In an aspect of the present disclosure, the instructions loaded into the multi-core CPU 102 may include program code to dynamically repair a local input/output (IO) unit of a first memory subsystem bank based on a first bank redundancy fuse input pattern of the first memory subsystem bank. The instructions loaded into the multi-core CPU 102 may also include program code to concurrently generate a redundancy shift signal in each global IO based on the current redundancy input pattern to shift the repaired local IO unit and lower order local IO units of the first memory subsystem bank relative to the repaired local IO unit.

Figure 2:
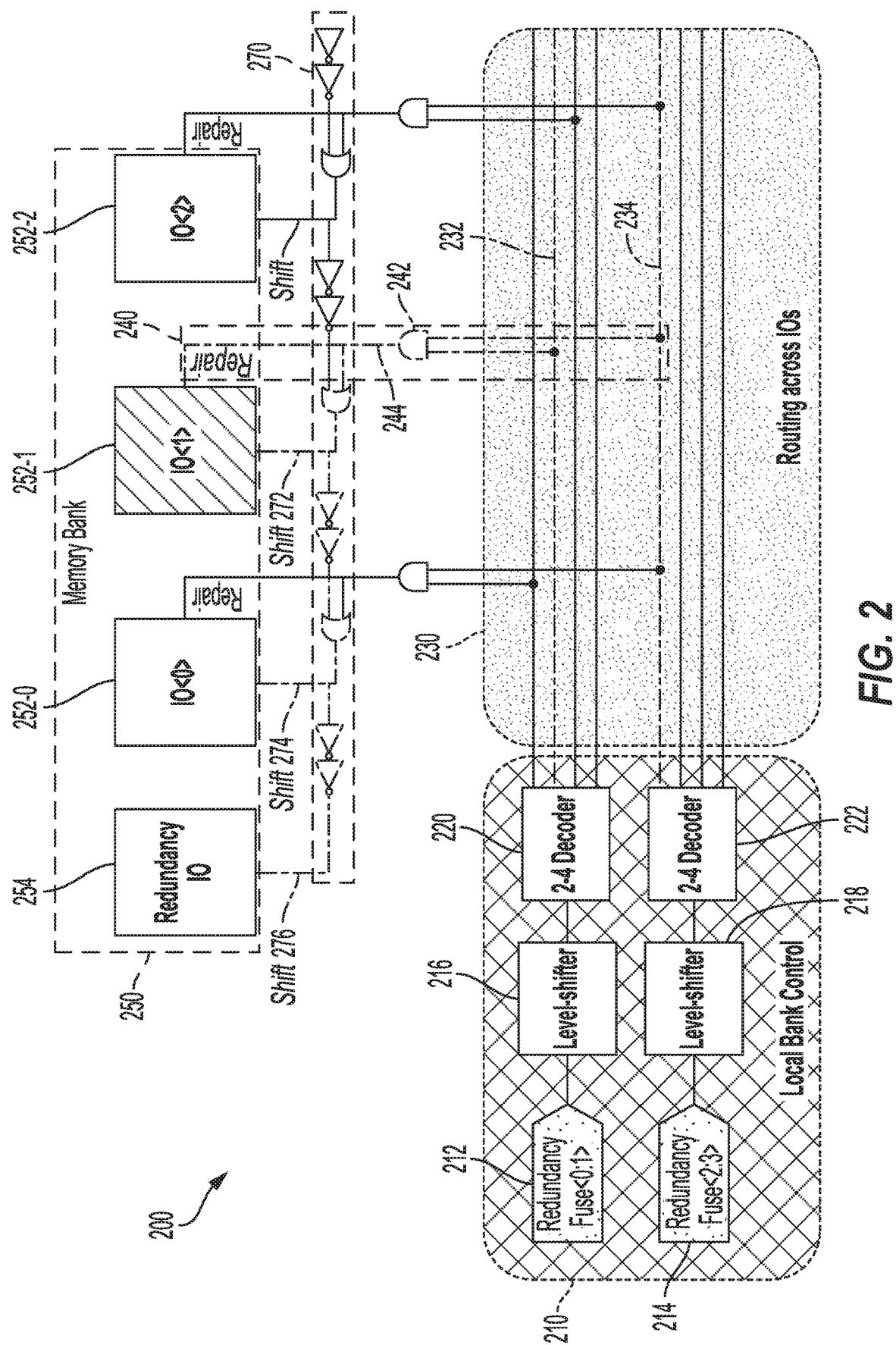
FIG. 2 is a circuit diagram of a redundancy scheme of a memory, in accordance with aspects of the present disclosure.

FIG. 2 is a circuit diagram of a redundancy scheme of a memory 200, such as the memory 118 shown in FIG. 1. The memory 200 is shown with a memory bank 250, which provides a medium for peripheral circuits (e.g., external to the memory 200) to write and read data (e.g., program instructions and data operated by the instruction). As described, the term "data" is understood to include program instructions, data, and any other information that may be stored in the memory 200. As described in further detail below, the memory 200 relies on redundancy fuses, such as a first redundancy fuse 212 (e.g., Redundancy Fuse <0:1>) and a second redundancy fuse 214 (e.g., Redundancy Fuse <2:3>), as well as a redundancy IO 254 to compensate for the defective (or nonconforming) bit cells (not shown).

In one configuration, the memory bank 250 includes the redundancy IO 254 as well as input/output (IO) units 252 (e.g., IO<0> 252-0, IO<1> 252-1, and IO<2> 252-2). The IO units 252 may provide access to bit cells for data storage, such as the noted defective (or nonconforming) bit cells. The memory 200 includes a local bank control 210. In this configuration, the local bank control 210 includes the first redundancy fuse 212 and the second redundancy fuse 214 to compensate for defective (or nonconforming) bit cells of the IO units 252, as follows.

For example, the local bank control 210 includes a first level shifter 216 coupled to the first redundancy fuse 212 and a second level shifter 218 coupled to the second redundancy fuse 214. A first decoder 220 (e.g., 2-4 Decoder) is coupled to the first level shifter 216, and a second decoder 222 (e.g., 2-4 Decoder) is coupled to the second level shifter 218. Based on values received from the first level shifter 216 and the second level shifter 218, an IO unit is selected from the IO units 252 by the first decoder 220 and the second decoder 222. That is, the first decoder 220 and the second decoder 222 perform a fuse decoding process to identify the selected IO unit (e.g., IO unit 252-1). In this example, compensation for defective bits of the IO unit 252-1 is performed. The IO unit 252-1 is selected through active signal lines 232 and 234 through a routing across IOs 230 to activate a repair branch 240.

In this configuration, the repair branch 240 includes a logic gate 242 (e.g., a logical AND gate) coupled to the active signal lines 232 and 234 to assert a repair signal 244 (e.g., active high) to the IO unit 252-1. As part of a repair process to the IO unit 252-1, a shift operation is also performed to the IO unit 252-1, as well as lower order ones of the IO units 252 (e.g., IO unit 252-0) and the redundancy IO 254. Performing of the shift operation is triggered by asserting a first shift signal 272, a second shift signal 274, and a third shift signal 276 using a daisy chain shift circuit 270. Asserting the shift signals to complete a static redundancy repair operation for the memory bank 250 slows operation of the memory 200, which may be a static random access memory (SRAM) subsystem.

Significant latency occurs because the first shift signal 272, the second shift signal 274, and the third shift signal 276 are delivered through the daisy chain shift circuit 270, especially when a high order IO unit is selected (e.g., IO<2> 252-2). In addition, conventional static redundancy logic in an SRAM subsystem involves both large routing and layout area for global signals and redundancy fuse decoding logic. In memory subsystem design, which is a trend of future memory architectures, redundancy fuses grow exponentially according to the size of the memory. Furthermore, state-of-the-art SRAM designs operate according to a dual power rail architecture in the interest of yield rate. Therefore, each redundancy fuse involves a level shifter inside the memory, which consumes valuable area, while wasting resources by burning power.

To solve the problem, a novel memory redundancy scheme combined with dynamic redundancy fuse selection and priority decoding logic is described to save area and power, while reducing global signal routing. Aspects of the present disclosure combine the concepts of dynamic memory redundancy and priority decoding to achieve a new redundancy scheme that saves power and area, while allowing the memory to operate at high frequency with enabled redundancy. In this redundancy architecture, redundancy fuses are merged into a global signal control block.

In aspects of the present disclosure, dynamic fuse selection is performed by a global signal control block according to the bank being accessed to reduce a number of level shifters relative to conventional static redundancy. In addition, the selected fuses are sent directly to each IO unit without pre-decoding to save routing resources. Instead of passing match/shift signals through daisy chains across the IO units, each IO unit includes dedicated logic to decode redundancy fuses. The dedicated logic generates match/shift signals for maintaining high frequency memory operation without the performance degradation of conventional static redundancy schemes.

Figure 3:
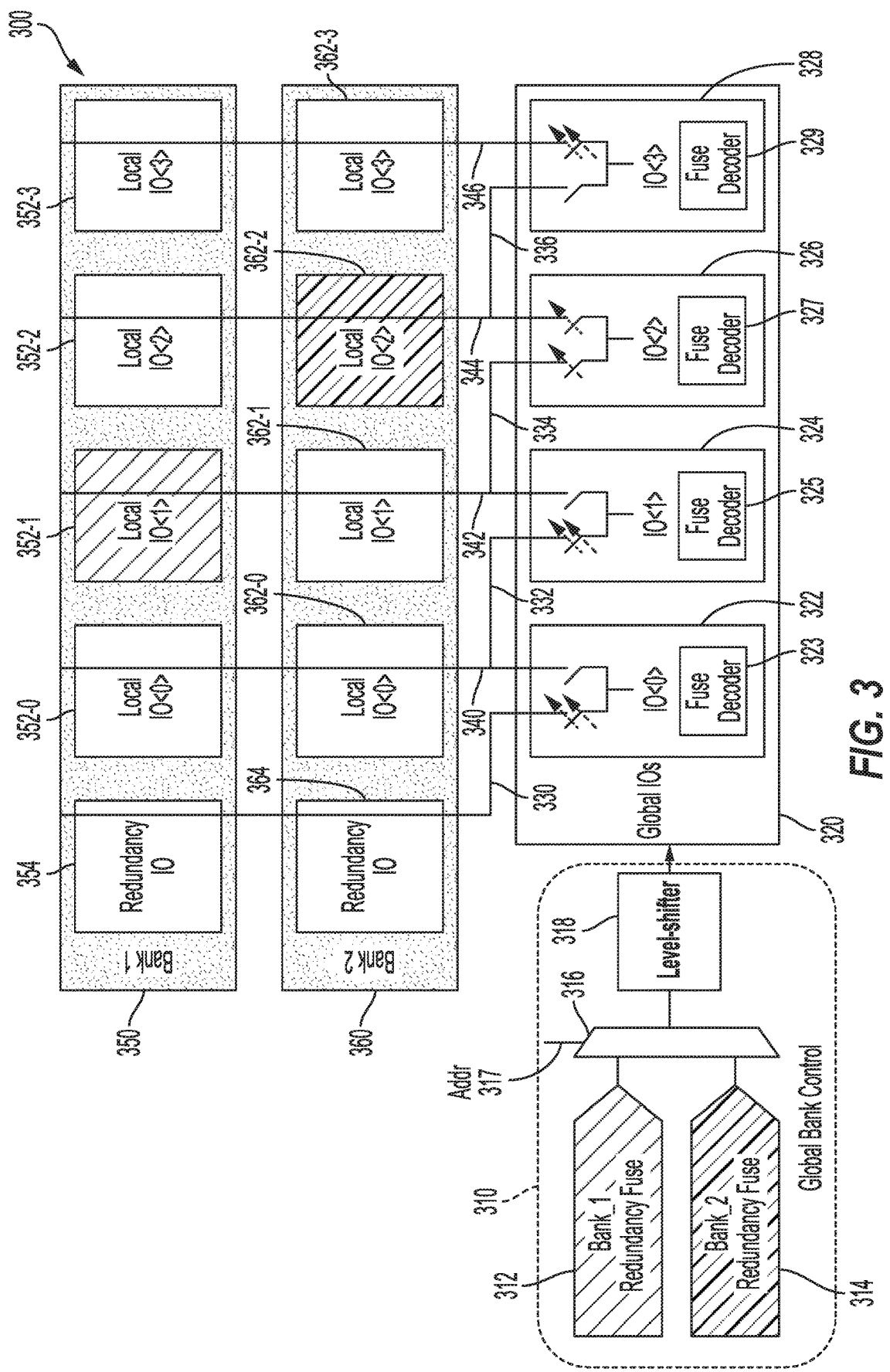
FIG. 3 is a circuit diagram of a logic configuration of a dynamic/segment redundancy architecture of a memory, in accordance with aspects of the present disclosure.

FIG. 3 is a circuit diagram of a memory subsystem dynamic redundancy architecture, in accordance with aspects of the present disclosure. A memory subsystem 300 may be any suitable memory technology, such as, by way of example, an SRAM (e.g., an eight-bank SRAM subsystem design). Nevertheless, as those skilled in the art will readily appreciate, the memory subsystem 300 is not necessarily limited to SRAM. An SRAM includes an array of storage elements known as "cells," "memory cells," or "bit cells." Each memory cell is configured to store one bit of data (e.g., a logic 1 or a logic 0). FIG. 3 shows a dual-bank configuration of the memory subsystem 300. Nevertheless, as those skilled in the art will readily appreciate, the memory subsystem 300 is not necessarily limited to a dual-bank memory subsystem.

The memory subsystem 300 is shown with a first memory bank 350 and a second memory bank 360, which provide a medium for peripheral circuits (e.g., external to the memory subsystem 300) to write and read data. In one configuration, the first memory bank 350 includes a first redundancy input/output (IO) unit 354, as well as local IO units 352 (e.g., IO<0> 352-0, IO<1> 352-1, IO<2> 352-2, and IO<3> 352-3). In addition, the second memory bank 360 includes a second redundancy IO unit 364, as well as local IO units 362 (e.g., IO<0> 362-0, IO<1> 362-1, IO<2> 362-2, and IO<3> 362-3). As described, the IO<3> 352-3 and the IO<3> 362-3 occupy high order positions relative to the IO<0> 352-0 and the IO<0> 362-0 of the local IO units 352 and the local IO units 362.

The memory subsystem 300 includes a global bank control 310 having a first bank redundancy fuse 312 and a second bank redundancy fuse 314 as inputs to a multiplexor 316. In this configuration, an address input signal 317 (e.g., Addr) to the multiplexor 316 dynamically selects between the first bank redundancy fuse 312 and the second bank redundancy fuse 314 as output to a level shifter 318. In this configuration, although inputs to the multiplexor 316 are static, the address input signal 317 dynamically selects between the first bank redundancy fuse 312 and the second bank redundancy fuse 314, as well as the first memory bank 350 and the second memory bank 360 during each cycle of the memory subsystem 300.

In aspects of the present disclosure, the memory subsystem 300 includes a global IO controller 320 coupled to the level shifter 318 of the global bank control 310. In this configuration, the global IO controller 320 include a first global IO 322, a second global IO 324, a third global IO 326, and a fourth global IO 328. The first global IO 322 includes a fuse decoder 323 configured to generate a repair signal 340 and a shift signal 330 for the local IO unit 352-0/362-0 depending on the selected bank. Similarly, the second global IO 324 includes a fuse decoder 325 configured to generate a repair signal 342 and a shift signal 332 for the local IO unit 352-1/362-1 depending on the selected bank. The third global IO 326 includes a fuse decoder 327 configured to generate a repair signal 344 and a shift signal 334 for the local IO unit 352-2/362-2 depending on the selected bank. In addition, the fourth global IO 328 includes a fuse decoder 329 configured to generate a repair signal 346 and a shift signal 336 for the local IO unit 352-3/362-3 depending on the selected bank.

In this example, compensation for defective bits of the local IO unit 352-1 is performed during a current cycle by the second global IO 324. Next, compensation for defective bits of the local IO unit 362-2 is performed during the next cycle by the third global IO 326. In this configuration, fuse decoding is performed by the fuse decoders (e.g., 323, 325, 327, and 329) in each of the global IOs (e.g., 322, 324, 326 and 328) to avoid routing constraints. The memory subsystem 300, therefore, provides dynamic redundancy using the address input signal 317, and priority decoding is performed by the fuse decoders (e.g., 323, 325, 327, and 329) to overcome routing constrains.

In this aspect of the present disclosure, the fuse decoders (e.g., 323, 325, 327, and 329) are configured to perform dynamic fuse selection according to the selected bank. In addition, the selected fuses (e.g., the first bank redundancy fuse 312 or the second bank redundancy fuse 314) are sent directly to each global IO unit of the global IO controller 320 without pre-decoding to save routing resources. Instead of passing match/shift signals through daisy chains across the global IO controller 320, each global IO unit (e.g., 322, 324, 326, and 323) includes dedicated logic to decode redundancy fuses (e.g., 323, 325, 327, and 329). The dedicated logic generates repair/shift signals for maintaining high frequency memory operation without the performance degradation of conventional static redundancy schemes, as further illustrated in FIG. 4.

Figure 4:
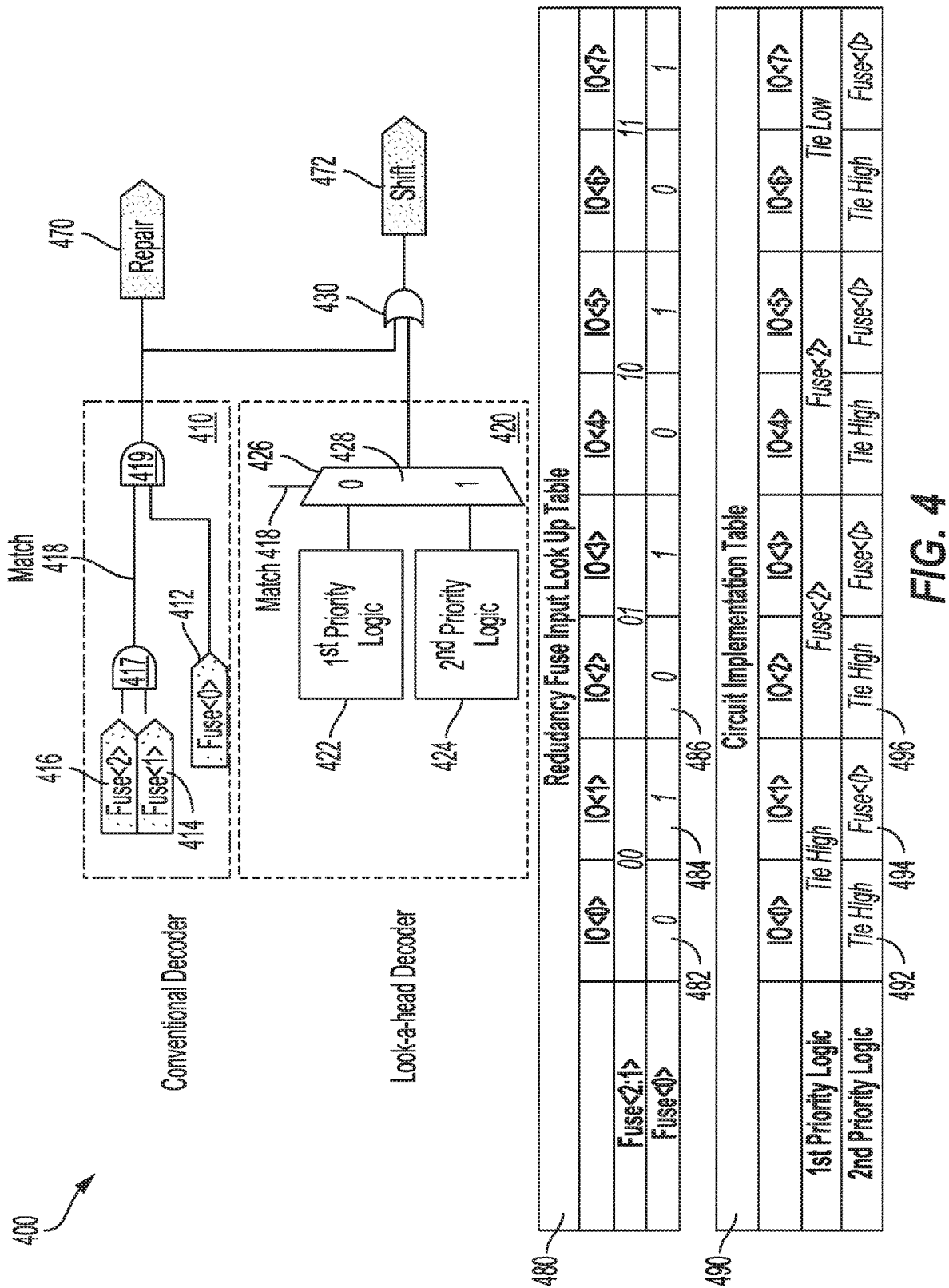
FIG. 4 is a circuit diagram of a configuration of a priority decoding scheme of a memory, in accordance with aspects of the present disclosure.

FIG. 4 is a circuit diagram illustrating a configuration of the fuse decoder of FIG. 3 based on a priority decoding scheme, in accordance with aspects of the present disclosure. In this aspect of the present disclosure, a fuse decoder 400 combines a fuse decoder 410 and a look-ahead decoder 420. In this configuration, the fuse decoder 410 includes a first fuse input 412 (e.g., Fuse<0>) to a logic gate 419 (e.g., a logic AND gate). The fuse decoder 410 also includes a second fuse input 414 (e.g., Fuse<1>) and a third fuse input 416 (e.g., Fuse<2>) to a logic gate 417 (e.g., a logic AND gate) configured to generate a match signal 418. The match signal 418 is provided as input to the logic gate 419 along with the first fuse input 412 to generate a repair signal 470.

In one configuration, the look-ahead decoder 420 includes a first priority logic 422 and a second priority logic 424, one of which is selected according to the match signal 418 from the fuse decoder 410. A multiplexor 426 selects between the first priority logic 422 and the second priority logic 424 based on the match signal 418 to generate an output signal 428. In this configuration, the output signal 428 of the multiplexor 426 and the repair signal 470 are provided to a logic gate 430 to generate a shift signal 472.

In this aspect of the present disclosure, the fuse decoder 400 combines the fuse decoder 410 and the look-ahead decoder 420, configured according to a redundancy fuse input look up table 480 and a circuit implementation table 490. In this example, the redundancy fuse input look up table 480 and the circuit implementation table 490 are defined for eight (8) IO units. As shown in FIG. 3, however, the memory subsystem 300 includes four (4) local IO units (e.g., local IO units 352 or local IO units 362) for each bank (e.g., the first memory bank 350 and the second memory bank 360). Configuration of the look-ahead decoder 420 based on the redundancy fuse input look up table 480 and the circuit implementation table 490 is further illustrated in FIG. 5.

Figure 5:
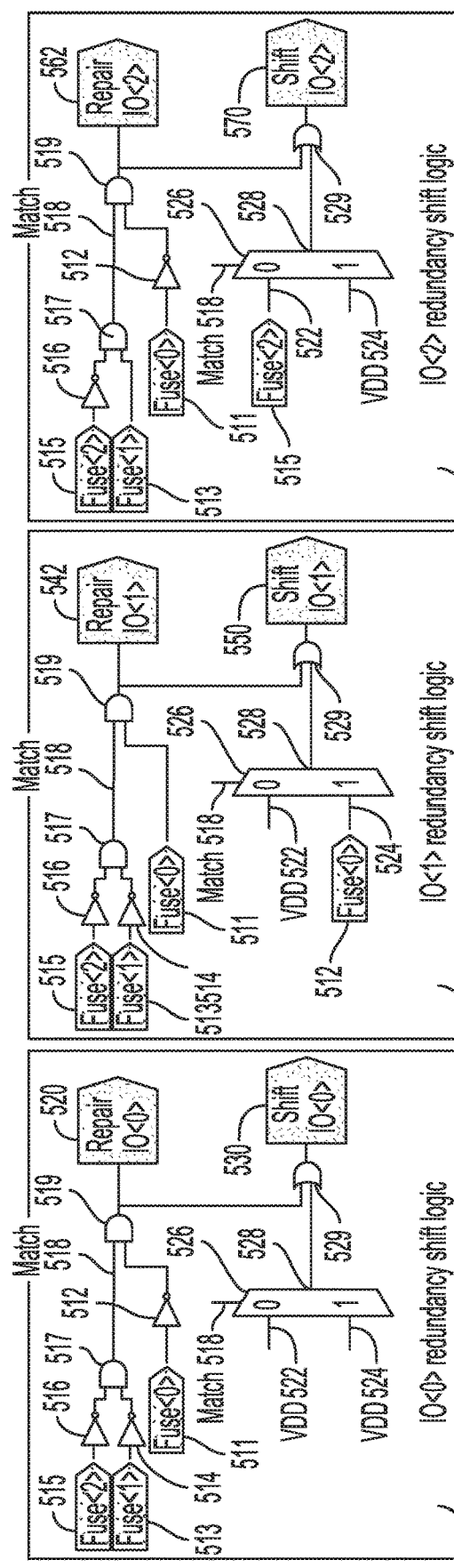
FIG. 5 is a circuit diagram further illustrating the priority decoding scheme of FIG. 4, in accordance with aspects of the present disclosure.

FIG. 5 is a circuit diagram 500 further illustrating the priority decoding scheme of FIG. 4, in accordance with aspects of the present disclosure. In this example, a fuse decoder 510 is shown for a first global IO, such as the first global IO 322 and the fuse decoder 323 of FIG. 3. In this configuration, the fuse decoder 510 includes fuse decode logic based on a first fuse input 511 (e.g., Fuse<0>) to a logic gate 512 (e.g., a NOT gate), a second fuse input 513 (e.g., Fuse<1>) to a logic gate 514 (e.g., a NOT gate), and a third fuse input 515 (e.g., Fuse<2>) to a logic gate 516 (e.g., a NOT gate). The logic gate 514 and the logic gate 516 are inputs to a logic gate 517 (e.g., a logic AND gate) configured to generate a match signal 518. The match signal 518 is provided as input to the logic gate 519 (e.g., a logic AND gate) along with the logic gate 512 to generate a repair signal 520, for example, for the local IO unit 352-0/362-0, depending on the selected bank in FIG. 3.

Referring again to the redundancy fuse input look up table 480, a bit pattern of column 482 (e.g., 000) corresponds to the first local IO unit (e.g., the local IO units 352-0/362-0). Accordingly, the logic configuration of the fuse decoder 510 asserts the repair signal 520 when a value of the first fuse input 511, the second fuse input 513, and the third fuse input 515 are each zero (e.g., 000). In addition, configuration of the first priority logic 422 and the second priority logic 424 is determined according to column 492 of the circuit implementation table 490. According to column 492, a first input 522 to a multiplexor 526 is tied high (e.g., VDD), and a second input 524 to the multiplexor 526 is also tied high (e.g., VDD). The multiplexor 526 selects between the first input 522 and the second input 524 based on the match signal 518 to generate an output signal 528. In this configuration, the output signal 528 of the multiplexor 526 and the repair signal 520 are provided to a logic gate 529 (e.g., a logic OR gate) to generate a shift signal 530.

According to this aspect of the present disclosure, configuration of the fuse decoder 510, based on row 503 of a redundancy shift truth table 502, asserts (e.g., "1") the repair signal 520 (e.g., Repair IO<0> in column 506) and the shift signal 530 (e.g., IO<0> Shift in column 508). As further illustrated by row 503 of the redundancy shift truth table 502, the repair signal and the shift signal for the other local IOs are concurrently de-asserted (e.g., "0").

As further illustrated in FIG. 5, a fuse decoder 540 is shown for a second global IO, such as the second global IO 324 with the fuse decoder 325 of FIG. 3. In this configuration, the fuse decoder 540 includes fuse decode logic based on the first fuse input 511 (e.g., Fuse<0>) to a logic gate 519 (e.g., a logic AND gate), the second fuse input 513 (e.g., Fuse<1>) to the logic gate 514 (e.g., a NOT gate), and the third fuse input 515 (e.g., Fuse<2>) to the logic gate 516 (e.g., a NOT gate). The logic gate 514 and the logic gate 516 are inputs to the logic gate 517 (e.g., a logic AND gate) configured to generate a match signal 518. The match signal 518 is provided as input to the logic gate 519 along with the first fuse input 511 to generate a repair signal 542, for example, for the local IO unit 352-1/362-1, depending on the selected bank in FIG. 3.

According to the redundancy fuse input look up table 480, a bit pattern of column 484 (e.g., 001) corresponds to the second local IO unit (e.g., the local IO units 352-1/362-1). In this example, the configuration of the fuse decoder 540 asserts the repair signal 542 when a value of the first fuse input 511 is one (1) and a value of the second fuse input 513 and a value of the third fuse input 515 are zero (e.g., 001). In addition, according to column 494 of the circuit implementation table 490, the first input 522 to the multiplexor 526 is tied high (e.g., VDD), and the second input 524 to the multiplexor 526 is the first fuse input (e.g., Fuse<0>). The multiplexor 526 selects between the first input 522 and the second input 524 based on the match signal 518 to generate the output signal 528. In this configuration, the output signal 528 of the multiplexor 526 and the repair signal 542 are provided to a logic gate 529 (e.g., a logic OR gate) to generate a shift signal 550.

According to this aspect of the present disclosure, configuration of the fuse decoder 540 is based on row 505 of the redundancy shift truth table 502 to assert (e.g., "1") the repair signal 542 (e.g., Repair IO<1> in column 506) and the shift signal 550 (e.g., IO<1> Shift in column 509). To prevent the daisy chain delay, the fuse decoder 510 concurrently asserts the shift signal 530, but de-asserts the repair signal 520 based on the input pattern (e.g., 001) in row 505 of column 504. As further illustrated by row 505 of the redundancy shift truth table 502, the repair signal and the shift signal for the other local IOs (e.g., higher order than IO<1>) are concurrently de-asserted (e.g., "0") based on the input pattern (e.g., 001).

Similarly, a fuse decoder 560 is shown for a third global IO, such as the third global IO 326 and the fuse decoder 327 of FIG. 3. In this configuration, the fuse decoder 560 includes fuse decode logic based on the first fuse input 511 (e.g., Fuse<0>) to a logic gate 512 (e.g., a logic NOT gate), the second fuse input 513 (e.g., Fuse<1>) to the logic gate 517 (e.g., a logic AND gate), and the third fuse input 515 (e.g., Fuse<2>) to the logic gate 516 (e.g., a logic NOT gate). The second fuse input 513 and the logic gate 516 are inputs to the logic gate 517 configured to generate the match signal 518. The match signal 518 is input to the logic gate 519 (e.g., a logic AND gate), along with the logic gate 512 to generate a repair signal 562, for example, for the local IO unit 352-2/362-2, depending on the selected bank in FIG. 3.

According to the redundancy fuse input look up table 480, a bit pattern of column 486 (e.g., 010) corresponds to the third local IO unit (e.g., the local IO units 352-2/362-2). In this example, the configuration of the fuse decoder 560 asserts the repair signal 562 when a value of the first fuse input 511 is zero (0), a value of the second fuse input 513 is one (1), and a value of the third fuse input 515 is zero (e.g., 010). In addition, according to column 496 of the circuit implementation table 490, the first input 522 to the multiplexor 526 is the third fuse input (e.g., Fuse<2>), and the second input 524 to the multiplexor 526 is tie high (e.g., VDD). The multiplexor 526 selects between the first input 522 and the second input 524 based on the match signal 518 to generate the output signal 528. In this configuration, the output signal 528 of the multiplexor 526 and the repair signal 542 are provided to the logic gate 529 (e.g., a logic OR gate) to generate a shift signal 570.

In this aspect of the present disclosure, configuration of the fuse decoder 560 is based on row 507 of the redundancy shift truth table 502 to assert (e.g., "1") the repair signal 562 (e.g., Repair IO<2> in column 506) and the shift signal 570 (e.g., IO<2> Shift in row 507). To prevent the daisy chain delay, the fuse decoder 540 concurrently asserts the shift signal 550, but de-asserts the repair signal 542 based on the input pattern (e.g., 010) in row 507 of column 504. Similarly, the daisy chain delay is avoided by the fuse decoder 510 concurrently asserting the shift signal 530, but de-asserting the repair signal 520 based on the input pattern (e.g., 010) in row 507 of column 504. As further illustrated by row 507 of the redundancy shift truth table 502, the repair signal and the shift signal for the other local IOs (e.g., higher order than IO<2>) are concurrently de-asserted (e.g., "0"). That is, each of the global IOs receive the same input pattern each cycle to enable concurrent shift signal generation to avoid the daisy chain delay of conventional implementation.

In an eight-bank SRAM subsystem design, if this new redundancy architecture is implemented, the number of redundancy fuse level shifters can be significantly reduced (e.g., by 75%) In addition, the number of global redundancy signals can be saved by a significant amount (e.g., 85%), and overall memory area can be reduced (e.g., by 3-4%) at an upper level without compromising redundancy coverage. These numbers may further improve for a larger number of banks.

Figure 6:
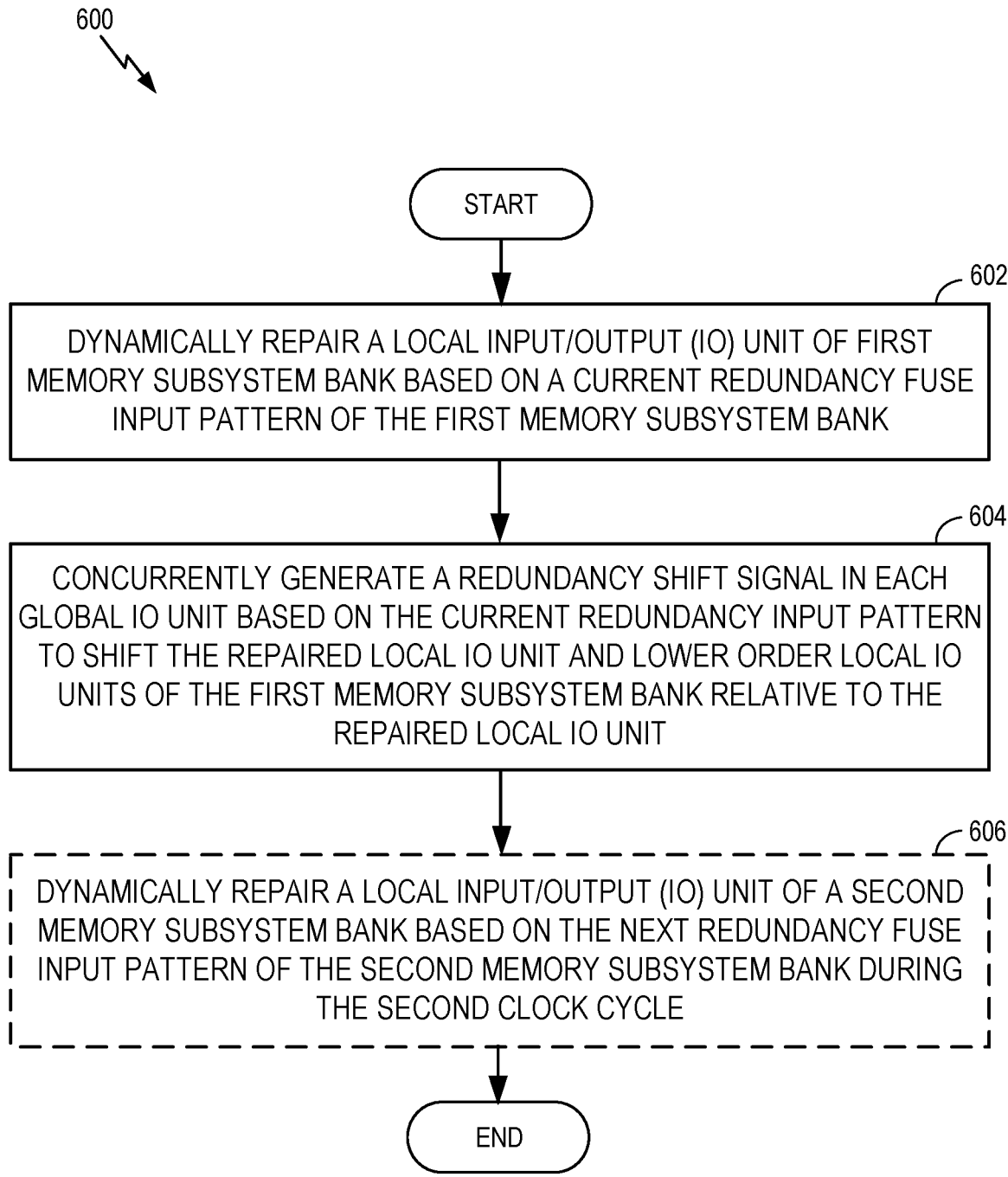
FIG. 6 is a flow diagram illustrating a method for a dynamic memory redundancy scheme with priority decoding, according to aspects of the disclosure.

FIG. 6 is a process flow diagram illustrating a method for a memory subsystem redundancy scheme with priority decoding, according to an aspect of the present disclosure. A method 600 begins in block 602, in which a local input/output (IO) unit of a first memory subsystem bank is dynamically repaired based on a current redundancy fuse input pattern. For example, as shown FIG. 5, configuration of the fuse decoder 540 is based on row 505 of the redundancy shift truth table 502 to assert (e.g., "1") the repair signal 542 (e.g., Repair IO<1> in column 506) and the shift signal 550 (e.g., IO<1> Shift in column 509) during a first clock cycle.

At block 604, a redundancy shift signal is concurrently generated in each global IO unit based on the current redundancy fuse input pattern to shift the repaired local IO unit and lower order local IO units of the first memory subsystem bank relative to the repaired local IO unit. For example, as shown FIG. 5, the fuse decoder 510 concurrently asserts the shift signal 530, but de-asserts the repair signal 520 based on the input pattern (e.g., 001) in row 505 of column 504. As further illustrated by row 505 of the redundancy shift truth table 502, the repair signal and the shift signal for the other local IO (e.g., higher order than IO<1>) are de-asserted (e.g., "0") during the first clock cycle.

At optional block 606, a local input/output (IO) unit of a second memory subsystem bank is dynamically repaired based on a next redundancy fuse input pattern (e.g., a second bank redundancy fuse input pattern) of the second memory subsystem bank received during a second clock cycle. As shown in FIGS. 3 and 4, a process for configuring the fuse decoders includes determining a position of local IO units (e.g., 352/362) associated with one of the global IO (e.g., 326). Once determined, the circuit implementation table 490 is accessed to determine a logic configuration of a fuse decoder 327 of the global IO 326 based on the determined position (e.g., 2). Configuring the fuse decoder 327 of the global IO 326 is performed according to the logic configuration determined from the circuit implementation table 490, such as the configuration of the fuse decoder 560 of FIG. 5.

According to aspects of the present disclosure, a memory subsystem redundancy scheme with priority decoding is described. The memory includes means for dynamically repairing a local input/output (IO) unit of a first memory subsystem bank based on a current redundancy fuse input pattern of the first memory subsystem bank. The means for dynamically repairing may, for example, include the fuse decoder 510, as shown in FIG. 5. The memory may also include means for concurrently generating a redundancy shift signal in each global IO based on the current redundancy input pattern to shift the repaired local IO unit and lower order local IO units of the first memory subsystem bank relative to the repaired local IO unit. The means for concurrently generating may, for example, include the fuse decoder 510 of FIG. 5. In another aspect, the aforementioned means may be any layer, module, or any apparatus configured to perform the functions recited by the aforementioned means. (Completed after claim language approval)

Figure 7:
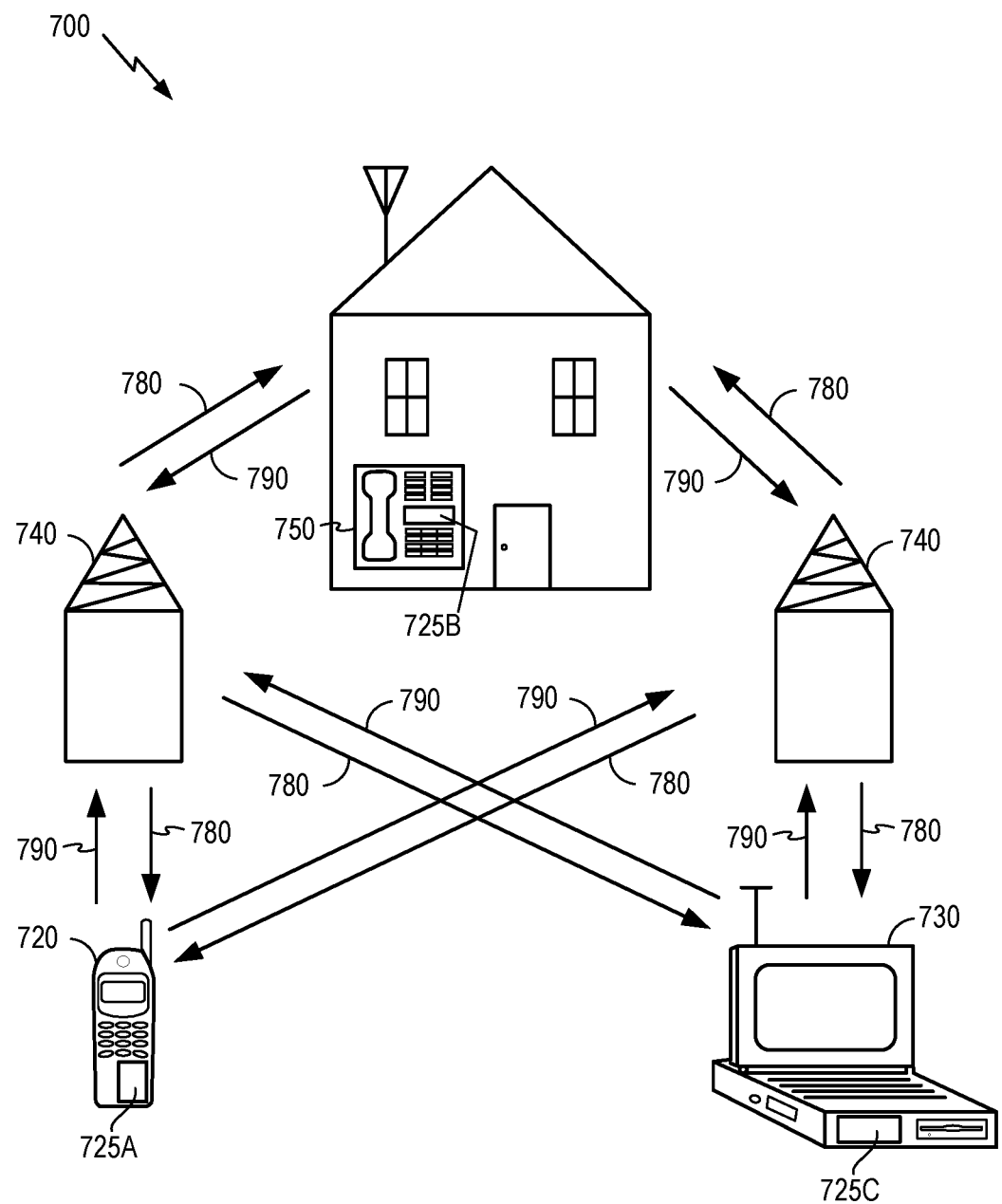
FIG. 7 is a block diagram showing a wireless communications system in which a configuration of the disclosure may be advantageously employed.

FIG. 7 is a block diagram showing an exemplary wireless communications system 700 in which a configuration of the disclosure may be advantageously employed. For purposes of illustration, FIG. 7 shows three remote units 720, 730, and 750, and two base stations 740. It will be recognized that wireless communications systems may have many more remote units and base stations. Remote units 720, 730, and 750 include IC devices 725A, 725B, and 725C, which include the disclosed memory subsystem redundancy scheme with priority decoding. It will be recognized that any device containing an IC may also include the disclosed memory subsystem redundancy scheme with priority decoding, including the base stations, switching devices, and network equipment. FIG. 7 shows forward link signals 780 from the base stations 740 to the remote units 720, 730, and 750, and reverse link signals 790 from the remote units 720, 730, and 750 to the base stations 740.

In FIG. 7, a remote unit 720 is shown as a mobile telephone, a remote unit 730 is shown as a portable computer, and a remote unit 750 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or any other device that stores or retrieves data or computer instructions, or any combination thereof. For example, a remote unit including the low power memory sub-system may be integrated within a vehicle control system, a server computing system, or other like system specifying critical data integrity. Although FIG. 7 illustrates IC devices 725A, 725B, and 725C, which include the disclosed memory subsystem redundancy scheme with priority decoding, the disclosure is not limited to these exemplary illustrated units. Aspects of the present disclosure may be suitably employed in any device, which includes the memory subsystem redundancy scheme with priority decoding.

For a firmware and/or software implementation, the methodologies may be implemented with modules (e.g., procedures, functions, and so on) that perform the described functions. Any machine-readable medium tangibly embodying instructions may be used in implementing the methodologies described. For example, software codes may be stored in a memory and executed by a processor unit. Memory may be implemented within the processor unit or external to the processor unit. As used herein, the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD) and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method for a memory subsystem redundancy with priority decoding, the method comprising:
   dynamically repairing a local input/output (IO) unit of a first memory subsystem bank based on a current redundancy fuse input pattern of the first memory subsystem bank;
   concurrently generating a redundancy shift signal in each global IO based on the current redundancy fuse input pattern to shift the repaired local IO unit and lower order local IO units of the first memory subsystem bank relative to the repaired local IO unit;
   receiving the current redundancy fuse input pattern during a first clock cycle;
   receiving a next redundancy fuse input pattern during a second clock cycle; and
   dynamically repairing the local input/output (IO) unit of a second memory subsystem bank based on the next redundancy fuse input pattern of the second memory subsystem bank during the second clock cycle.

2. The method of claim 1, further comprising:
   determining a position of local IO units associated with one of the global IO;
   accessing a circuit implementation table to determine a logic configuration of a fuse decoder of the global IO; and
   configuring the fuse decoder of the global IO according to the logic configuration determined from the circuit implementation table.

3. The method of claim 1, further comprising concurrently de-asserting the redundancy shift signal by each fuse decoder of the global IO having higher order local IO units relative to the repaired IO unit.

4. The method of claim 1, in which dynamically repairing comprises:
   asserting a repair signal by a fuse decoder of the global IO associated with the repaired local IO unit; and
   asserting the redundancy shift signal by the fuse decoder of the global IO associated with the repaired local IO unit.

5. The method of claim 1, further comprising concurrently generating the redundancy shift signal in each global IO unit based on the next redundancy fuse input pattern to shift the repaired local IO unit and lower order local IO units of the second memory subsystem bank relative to the repaired local IO unit.

6. A non-transitory computer-readable medium having program code recorded thereon for memory subsystem redundancy with priority decoding, the program code executed by a processor and comprising:
   program code to dynamically repair a local input/output (IO) unit of a first memory subsystem bank based on a current redundancy fuse input pattern of the first memory subsystem bank;
   program code to concurrently generate a redundancy shift signal in each global IO based on the current redundancy fuse input pattern to shift the repaired local IO unit and lower order local IO units of the first memory subsystem bank relative to the repaired local IO unit;
   program code to receive the current redundancy fuse input pattern during a first clock cycle;
   program code to receive a next redundancy fuse input pattern during a second clock cycle; and
   program code to dynamically repair the local input/output (IO) unit of a second memory subsystem bank based on the next redundancy fuse input pattern of the second memory subsystem bank during the second clock cycle.

7. The non-transitory computer-readable medium of claim 6, further comprising:
   program code to determine a position of local IO units associated with one of the global IO;
   program code to access a circuit implementation table to determine a logic configuration of a fuse decoder of the global IO; and program code to configure the fuse decoder of the global IO according to the logic configuration determined from the circuit implementation table.

8. The non-transitory computer-readable medium of claim 6, further comprising program code to concurrently de-assert the redundancy shift signal by each fuse decoder of the global IO having higher order local IO units relative to the repaired IO unit.

9. The non-transitory computer-readable medium of claim 6, in which the program code to dynamically repair comprises:
    program code to assert a repair signal by a fuse decoder of the global IO associated with the repaired local IO unit; and
    program code to assert the redundancy shift signal by the fuse decoder of the global IO associated with the repaired local IO unit.

10. The non-transitory computer-readable medium of claim 6, further comprising program code to concurrently generate the redundancy shift signal in each global IO unit based on the next redundancy input pattern to shift the repaired local IO unit and lower order local IO units of the second memory subsystem bank relative to the repaired local IO unit.

11. A memory subsystem, comprising:
    a first memory subsystem bank comprising a plurality of a local input/output (IO) units and a first redundancy input/output (IO) unit; and
    a global IO controller comprising a plurality of global input/output (IO) units, each corresponding to a respective one of the plurality of local IO units and comprising a fuse decoder configured to dynamically repair a repaired local IO unit based on a first bank redundancy fuse input pattern of the first memory subsystem bank,
    the global IO controller configured to concurrently trigger a redundancy shift signal in each global IO unit based on the first bank redundancy fuse input pattern to shift the repaired local IO unit and lower order ones of the plurality of local IO units of the first memory subsystem bank relative to the repaired local IO unit,
    in which the global IO controller is further configured to receive the first bank redundancy fuse input pattern during a first clock cycle, and to receive a next redundancy fuse input pattern during a second clock cycle, and to trigger dynamic repairing the local input/output (IO) unit of a second memory subsystem bank based on the next redundancy fuse input pattern of the second memory subsystem bank during the second clock cycle.

12. The memory subsystem of claim 11, further comprising:
    a second memory subsystem bank comprising a plurality of local input/output (IO) units and a second redundancy IO unit.

13. The memory subsystem of claim 12, further comprising:
    a global bank control coupled to the global IO controller and comprising:
    a multiplexor having the first bank redundancy fuse input pattern and a second bank redundancy fuse input pattern of the second memory subsystem bank as inputs, the multiplexor configured to dynamically selects between the first bank redundancy fuse input pattern and the second bank redundancy fuse input pattern based an address input signal, and
    a level shifter coupled to as output of the multiplexor.

14. The memory subsystem of claim 11, in which the fuse decoder comprises:
    fuse decode logic configured to assert a repair signal according to the first bank redundancy fuse input pattern of the first memory subsystem bank; and
    a look-ahead decoder, configured to generate the redundancy shift signal according to a position of local IO units associated with one of the plurality of global IO units including the fuse decoder.

15. The memory subsystem of claim 14,
    in which the fuse decode logic of the fuse decoder of the global IO unit associated with the repaired local IO unit is configured to assert the repair signal, and
    in which the look-ahead decoder of the fuse decoder of the global IO unit associated with the repaired local IO unit is configured to assert the redundancy shift signal.

16. The memory subsystem of claim 11, in which the global IO controller is configured to trigger concurrent de-assertion of the redundancy shift signal by the fuse decoder of each of the plurality of global IO units having higher order local IO units relative to the repaired IO unit.

17. The memory subsystem of claim 11, in which the global IO controller is further configured to trigger concurrent generation of the redundancy shift signal in each of the plurality of global IO units based on the next redundancy input pattern to shift the repaired local IO unit and lower order local IO units of the second memory subsystem bank relative to the repaired local IO unit.

* * * * *